(12) United States Patent
Tian

(10) Patent No.: US 11,415,638 B2
(45) Date of Patent: Aug. 16, 2022

(54) TEST METHOD AND TEST DEVICE FOR ADAPTER

(71) Applicant: GUANGDONG OPPO MOBILE TELECOMMUNICATIONS CORP., LTD., Guangdong (CN)

(72) Inventor: Chen Tian, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 276 days.

(21) Appl. No.: 16/628,924

(22) PCT Filed: Sep. 30, 2018

(86) PCT No.: PCT/CN2018/109081
§ 371 (c)(1),
(2) Date: Jan. 6, 2020

(87) PCT Pub. No.: WO2020/062236
PCT Pub. Date: Apr. 2, 2020

(65) Prior Publication Data
US 2021/0033681 A1 Feb. 4, 2021

(51) Int. Cl.
*G01R 31/40* (2020.01)
*G01K 3/00* (2006.01)
*G01R 31/00* (2006.01)

(52) U.S. Cl.
CPC .............. *G01R 31/40* (2013.01); *G01K 3/005* (2013.01); *G01R 31/003* (2013.01)

(58) Field of Classification Search
CPC ...... G01R 31/40; G01R 31/003; G01R 31/00; G01R 31/28; G01R 31/2849; G01K 3/005; G01K 13/00; G01M 99/002; H02J 7/02
(Continued)

(56) References Cited

U.S. PATENT DOCUMENTS 9,766,276 B2 9/2017 Uan-Zo-Li et al.
2011/0169521 A1 7/2011 Xie
(Continued)

FOREIGN PATENT DOCUMENTS

CN 101865958 A 10/2010
CN 102129044 A 7/2011
(Continued)

OTHER PUBLICATIONS

OA and English translation of CN application 201880024725.0 mailed Jul. 9, 2020.
(Continued)

*Primary Examiner* — Farhana A Hoque
(74) *Attorney, Agent, or Firm* — Young Basile Hanlon & MacFarlane, P.C.

(57) ABSTRACT

The present disclosure provides a test method and a test device for an adapter. The method includes: detecting temperatures of elements in the adapter; determining whether the adapter is in a temperature balance state according to the temperatures of the elements in the adapter; increasing an ambient temperature of an environment where the adapter is located in response to the temperature balance state; detecting an output power of the adapter, and determining whether the adapter performs a power reduction operation before the temperatures of the elements reach a first preset temperature threshold; and determining that a test for the adapter fails when the power reduction operation does not occur.

15 Claims, 2 Drawing Sheets

(58) Field of Classification Search
USPC .................................................. 324/750.03
See application file for complete search history.

(56) References Cited

U.S. PATENT DOCUMENTS

| | | | |
|---|---|---|---|
| 2013/0049794 A1 | 2/2013 | Humphrey et al. | |
| 2017/0179741 A1* | 6/2017 | Tian | H02J 7/00304 |
| 2018/0156552 A1 | 6/2018 | Tu et al. | |

FOREIGN PATENT DOCUMENTS

| | | |
|---|---|---|
| CN | 103675654 A | 3/2014 |
| CN | 205484580 U | 8/2016 |
| CN | 106019111 A | 10/2016 |
| CN | 206020564 U | 3/2017 |
| CN | 207352137 U | 5/2018 |
| CN | 108153638 A | 6/2018 |
| CN | 207884508 U | 9/2018 |
| JP | H06180341 A | 6/1994 |
| JP | 2009106010 A | 5/2009 |
| JP | 2018109565 A | 7/2018 |
| KR | 20010037932 A | 5/2001 |
| KR | 20170072901 A | 6/2017 |
| KR | 20180012423 A | 2/2018 |

OTHER PUBLICATIONS

International Search Report with English translation for PCT application PCT/CN2018/109081.
Extended European Search Report for EP application 18933735.5 dated Oct. 15, 2020.
OA for IN application 201917054205 mailed Dec. 7, 2020.
Notice of Allowance with English translation for CN application 201880024725.0 dated Oct. 30, 2020.
Japanese Office Action with English Translation for JP Application 2020-501808 dated Mar. 19, 2021. (13 pages).
Korean Office Action with English Translation for KR Application 10-2020-7001952 dated Apr. 13, 2021. (31 pages).
Korean Office Action with English Translation for KR Application 10-2020-7001952 dated Oct. 26, 2021. (4 pages).

* cited by examiner

TEST METHOD AND TEST DEVICE FOR ADAPTER

CROSS-REFERENCE TO RELATED APPLICATION(S)

This application is a 371 application of International Application No. PCT/CN2018/109081, filed on Sep. 30, 2018, the entire disclosure of which is hereby incorporated by reference.

TECHNICAL FIELD

The present disclosure relates to a field of electronic device technologies, and more particularly, to a test method and a test device for an adapter, and a storage medium.

BACKGROUND

At present, adapters are widely applied to a charging field of electrical equipment, and may convert alternating current into direct current which accords with operation of the electrical equipment. It may be appreciated that performance of the adapter needs to be tested during a development phase to ensure that in actual use, the adapter is in compliance with relevant standards and requirements.

SUMMARY

In a first aspect, embodiments of the present disclosure provide a test method for an adapter. The method includes:
detecting temperatures of elements in the adapter;
determining whether the adapter is in a temperature balance state according to the temperatures of the elements in the adapter;
increasing an ambient temperature of an environment where the adapter is located in response to the adapter being in the temperature balance state;
detecting an output power of the adapter, and determining whether the adapter performs a power reduction operation before the temperatures of the elements reach a first preset temperature threshold; and
determining that a test for the adapter fails when the adapter does not perform the power reduction operation.

In a second aspect, embodiments of the present disclosure provide a test device for an adapter, including:
a temperature detector, configured to detect temperatures of elements in the adapter;
a power detector, configured to detect an output power of the adapter;
an ambient temperature regulator, configured to regulate an ambient temperature of an environment where the adapter is located;
a controller, configured to determine whether the adapter is in a temperature balance state according to the temperatures of the elements in the adapter, to control the ambient temperature regulator to increase the ambient temperature in response to the adapter being in the temperature balance state, to determine whether the adapter performs a power reduction operation before the temperatures of the elements in the adapter reach a first preset temperature threshold, and to determine that a test for the adapter fails if the adapter does not perform the power reduction operation.

In a third aspect, embodiments of the present disclosure provide a computer readable storage medium having a computer program stored thereon. When the program is executed by a processor, a test method for an adapter according to the above embodiments is implemented.

Additional aspects and advantages of embodiments of present disclosure will be given in part in the following descriptions, become apparent in part from the following descriptions, or be learned from the practice of the embodiments of the present disclosure.

BRIEF DESCRIPTION OF DRAWINGS

These and other aspects and advantages of embodiments of the present disclosure will become apparent and more readily appreciated from the following descriptions made with reference to the accompanying drawings.

DETAILED DESCRIPTION

Embodiments of the present disclosure are described below in detail, examples of the embodiments are shown in accompanying drawings, and reference signs that are the same or similar from beginning to end represent the same or similar components or components that have the same or similar functions. The embodiments described below with reference to the accompanying drawings are examples, are merely used to explain the present disclosure, and cannot be construed as a limit to the present disclosure.

In the related art, testing an adapter normally refers to testing parameters such as an output voltage, an output current, or stability of the adapter. However, applicant has found that factors affecting the safety of the adapter include not only the output voltage, the output current or the stability, but also functions of internal elements. However, in the related art, only parameters such as the output voltage, the output current or the stability of the adapter are tested, and a detection of internal functions of the adapter is lacked. For example, elements in the adapter are susceptible to ambient temperature, and thus the risk of using the adapter in a high-temperature environment is higher than that in a low-temperature environment. Since the performance of the internal elements in the adapter under the high-temperature environment cannot be detected in the related art, the risk of using the adapter is increased.

With respect to a technical problem in the related art that when testing an adapter, it is unable to test whether the adapter may automatically realize an over-temperature protection when the temperature is too high, embodiments of the present disclosure provide a test method for an adapter.

The test method for the adapter according to embodiments of the present disclosure detects a temperature of each main element in the adapter. When the temperature of each element is in a balance state and does not reach a set safety threshold, the method increases an ambient temperature to enable the temperature of the adapter to reach the set safety threshold, and further detects whether the adapter has a power-reduction protection operation. In this way, an over-temperature protection mechanism of the adapter is detected.

The test method and test device for the adapter according to embodiments of the present disclosure are described below with reference to the accompanying drawings.

The test method for the adapter provided by the embodiments of the present disclosure may be executed by the test device for the adapter provided by the embodiments of the present disclosure, and the device is configured to test the adapter.

Figure 1:
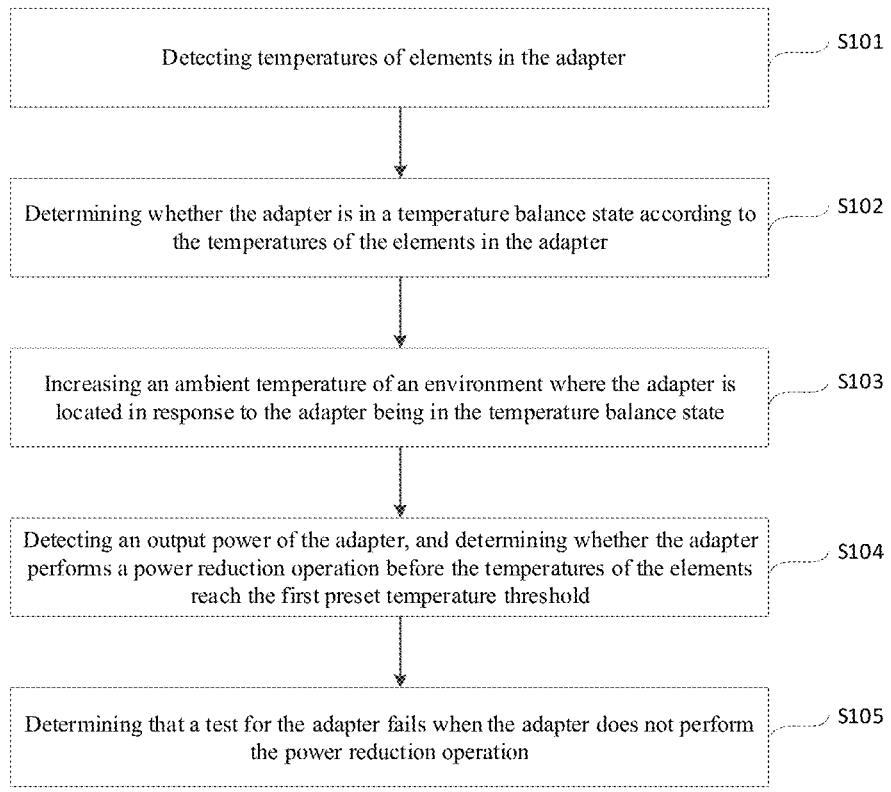
FIG. 1 is a flowchart of a test method for an adapter according to embodiments of the present disclosure.

FIG. 1 is a flowchart of a test method for an adapter according to embodiments of the present disclosure. As illustrated in FIG. 1, the test method for the adapter includes the followings.

At block 101, temperatures of elements in the adapter are detected.

In detail, when the adapter is tested, a load is connected to the adapter first, so that the adapter enters a normal charging mode, for testing operation parameters, such as an output voltage, an output current and an output power of the adapter in actual use, and the temperatures of the elements in the adapter. The load may be a piece of electric equipment such as a mobile phone, or a piece of test equipment such as a charging decoy device. For example, when the adapter is a flash-charging power adapter, the adapter may be connected to a mobile phone and controlled to enter a fast charging mode, so that operation parameters, such as an output voltage, an output current and an output power of the flash-charging power adapter in the fast charging mode, and temperatures of elements in the adapter may be detected.

It should be noted that, in order to make the temperatures of the elements in the adapter quickly reach the safe temperature threshold, and to shorten test time, the adapter may be controlled to perform a full-load output. When the adapter performs the full-load output, heat generated by the adapter may be increased, and further, the elements in the adapter may easily reach the safe temperature threshold. In addition, when the temperatures of the elements in the adapter are close to the safe temperature threshold, the operation parameters such as the output voltage and the output current of the adapter in the current state may be tested, so that the performance of the adapter under a high temperature and a high load may be detected, and the reliability of the test may be improved.

It may be understood that, in order to improve the accuracy of the test and to prevent an external temperature variation from affecting a detection of the operation parameters of the adapter, the adapter needs to be placed in a stable ambient temperature. As a possible implementation, the adapter may be placed in a thermostated container for test, and an initial value of the ambient temperature during the test is set by the thermostated container. For example, air in the thermostated container is heated by an air heater in the thermostated container, and the initial value of the ambient temperature is set in a range of 38 to 42 degrees.

In detail, when the temperatures of the elements are detected, the temperatures of elements in the adapter may be detected in different modes according to different practical applications.

As a possible implementation, each main element in the adapter is connected to the test device for the adapter through a temperature sensing wire. When the temperature of the element rises and a temperature gradient exists between the element and the other end of the corresponding temperature sensing wire, current is generated in the temperature sensing wire due to thermo-electromotive force existing across two ends of the wire. And then, the test device for the adapter acquires the current generated in the temperature sensing wire and determines the temperature of the main element according to a mapping relation between the current and the temperature. The main elements connected to the temperature sensing wires may include various field effect transistors, transformers, capacitors, microcontroller units (MCU) and other elements in the adapter.

As another possible implementation, when the temperatures of respective elements in the adapter cannot be tested at the same time, a temperature sensor may be disposed in the adapter. The temperature sensor may detect elements such as a microcontroller unit whose operation parameters may be greatly affected by the temperature, and may send acquired data to the test device for the adapter after detecting the temperatures of the elements.

At block 102, it is determined whether the adapter is in a temperature balance state according to the temperatures of the elements in the adapter.

The temperature balance state means that the temperatures of the elements in the adapter are kept constant within a preset time period or a temperature variation is within a set range. For example, when the temperature variation of the elements in the adapter is less than 1° C. within half an hour, it is determined that the adapter is in the temperature balance state.

During specific implementation, after the temperatures of the elements in the adapter are obtained, the temperature of each element in the adapter may be acquired continuously with the above-mentioned method and stored. In addition, when the temperatures of the elements in the adapter are obtained, timing may be performed simultaneously through a timing device, to determine the test time. Further, it is detected whether the temperature variation of the elements in the adapter exceed the preset range within the preset time period, thereby determining whether the adapter is in the temperature balance state.

At block 103, an ambient temperature of an environment where the adapter is located is increased in response to the adapter being in the temperature balance state.

Specifically, when it is determined that the adapter is in the temperature balance state during the full-load output and each main element in the adapter has not reached the safe temperature threshold, in order to detect whether the adapter may perform the over-temperature protection when the main element reaches the safe temperature threshold, the ambient temperature of the environment where the adapter is located may be raised, so that the temperature of each main element in the adapter is raised, and the temperature of the element in the adapter may reach the safe temperature threshold.

In specific implementation, as a possible implementation, an output temperature of the thermostated container may be increased to increase the ambient temperature of the environment where the adapter is located. It should be noted that, since the elements in the adapter may have different safe temperature thresholds, in order to avoid damaging the elements due to an excessively high ambient temperature, the safe temperature threshold of the element with the lowest safe temperature threshold among the main elements may be taken as a first preset temperature threshold, and the ambient temperature may be further increased to the first preset temperature threshold. As an example, for respective main elements in the adapter, when the safe temperature thresholds of the field effect transistor, the MCU, the capacitors at all levels and the transformer are 125° C., 85° C., 200° C. and 105° C., respectively, and when the temperature of each element in the adapter is raised to 60° C. and is in the temperature balance state, the safe temperature threshold of the MCU is used as the first preset temperature threshold, and further the output temperature of the thermostated container is increased, to increase the internal ambient temperature of the adapter to 85° C., thereby facilitating a subsequent test of whether the adapter triggers the over-temperature protection operation when the temperature of the MCU reaches the safe temperature threshold.

At block 104, an output power of the adapter is detected, and it is determined whether the adapter performs a power reduction operation before the temperatures of the elements reach the first preset temperature threshold.

The first preset temperature threshold may be the safe temperature threshold of the element with the lowest safe temperature threshold among the main elements described in the above example, or may be an average safe temperature threshold of the main elements.

During specific implementation, the output power of the adapter may be detected by a power meter when the temperatures of the elements in the adapter are close to the first preset temperature threshold. After that, the detection result is compared with the output power of the adapter at the beginning of the test. And further, it may be determined whether the adapter performs the power reduction operation to carry out the over-temperature protection before the temperatures of the elements in the adapter reach the first preset temperature threshold.

As an implementation of reducing power of the adapter, a temperature sensor may be arranged in the adapter. The temperature sensor sends detected temperature of the elements in the adapter to the MCU. When the temperature of the elements detected by the sensor reaches a second preset temperature threshold, the MCU controls the adapter to perform the power reduction operation. The second preset temperature threshold is less than the first preset temperature threshold, so that the elements in the adapter are prevented from being damaged due to an excessive temperature during test. Furthermore, it is convenient to observe whether the power reduction operation of the adapter occurs or not before the temperatures of the elements in the adapter reach the first preset temperature threshold.

At block 105, it is determined that a test for the adapter fails when the adapter does not perform the power reduction operation.

Specifically, when it is determined that the power of the adapter is reduced before the temperatures of the elements in the adapter reach the first preset temperature threshold, it indicates that the adapter reduces the output current and voltage and further reduces the heat generated by reducing the output power, thereby achieving the purpose of reducing the operation temperature of the elements in the adapter. Consequently, it is determined that the adapter may execute the over-temperature protection operation and the adapter passes the test. When the power reduction of the adapter is not detected, it is determined that the adapter does not have the over-temperature protection mechanism, and thus the test fails.

In conclusion, with the test method for the adapter according to embodiments of the present disclosure, the temperatures of the elements in the adapter are detected first, and then it is determined whether the adapter is in the temperature balance state according to the temperatures of the elements in the adapter, and the ambient temperature of the environment where the adapter is located is increased in response to the adapter being in the temperature balance state, and further the output power of the adapter is detected and it is determined whether the adapter performs the power reduction operation before the temperatures of the elements reach the first preset temperature threshold, and it is determined that the test for the adapter fails when the power reduction operation does not occur. Therefore, the method detects an over-temperature protection mechanism of the adapter by determining whether the adapter has the power-reduction protection operation before reaching the safe temperature threshold, which increases an over-temperature-protection test item of the adapter, and ensures that the adapter that has gone through the detection may reduce the temperature by reducing the output power, thereby avoiding a damage to the adapter due to an excessive temperature in the actual use and improving the reliability of the test for the adapter. In addition, test costs may be reduced as the test method for the adapter according to the present disclosure may be automatically realized by the adapter without the participation of a tester.

Figure 2:
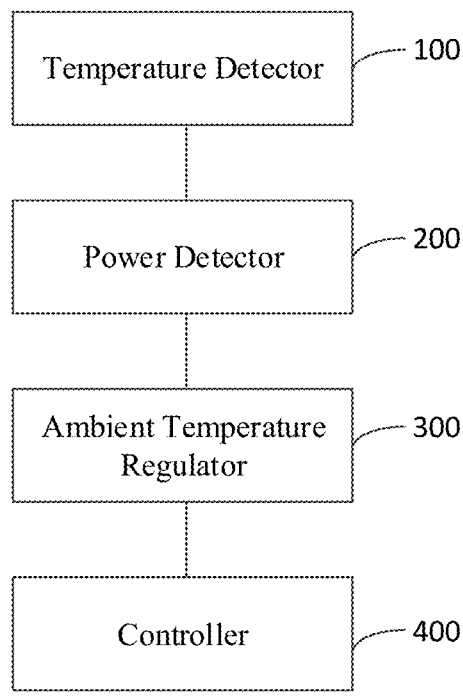
FIG. 2 is a block diagram of a test device for an adapter according to embodiments of the present disclosure.

In order to implement the foregoing embodiments, embodiments of the present disclosure further provide a test device for an adapter. FIG. 2 is a block diagram of a test device for an adapter according to embodiments of the present disclosure. As illustrated in FIG. 2, the test device for the adapter includes: a temperature detector 100, a power detector 200, an ambient temperature regulator 300 and a controller 400.

The temperature detector 100 is configured to detect temperatures of elements in the adapter.

The power detector 200 is configured to detect an output power of the adapter.

The ambient temperature regulator 300 is configured to regulate an ambient temperature of an environment where the adapter is located.

The controller 400 is configured to control the adapter to enter a full-load output state, to determine whether the adapter is in a temperature balance state according to the temperatures of the elements in the adapter, to control the ambient temperature regulator to increase the ambient temperature in response to the adapter being in the temperature balance state, and to determine whether the adapter performs a power reduction operation before the temperatures of the elements in the adapter reach the first preset temperature threshold.

In one embodiment of the present disclosure, the ambient temperature regulator 300 is further configured to set an initial value of the ambient temperature in a range of 38 to 42 degrees.

In one embodiment of the present disclosure, the controller 400 is further configured to control the adapter to perform the power reduction operation when the temperatures detected by the temperature detector 100 reach the second preset temperature threshold, in which the second preset temperature threshold is less than the first preset temperature threshold.

It should be noted that the foregoing description of the method embodiments is also applicable to the device in embodiments of the present disclosure. The implementation principles are similar, and will not be repeated herein.

In conclusion, with the test device for the adapter according to embodiments of the present disclosure, the temperatures of the elements in the adapter are detected first, and then it is determined whether the adapter is in the temperature balance state according to the temperatures of the elements in the adapter, and the ambient temperature of the environment where the adapter is located is increased in response to the adapter being in the temperature balance state, and further the output power of the adapter is detected and it is determined whether the adapter performs the power reduction operation before the temperatures of the elements reach the first preset temperature threshold, and it is determined that the test for the adapter fails when the power reduction operation does not occur. Therefore, the device detects an over-temperature protection mechanism of the adapter by determining whether the adapter has the power-reduction protection operation before reaching the safe temperature threshold, which increases an over-temperature-protection test item of the adapter, and ensures that the adapter that has gone through the detection may reduce the temperature by reducing the output power, thereby avoiding a damage to the adapter due to an excessive temperature in the actual use and improving the reliability of the test for the adapter.

In order to implement the above embodiments, the present disclosure further provides an electronic device.

Figure 3:
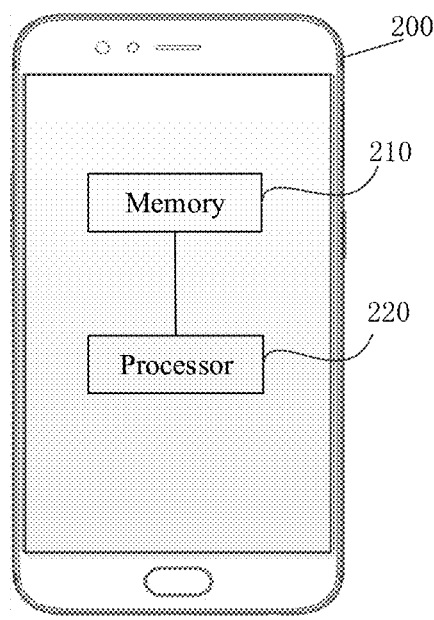
FIG. 3 is a schematic diagram of an electronic device according to an embodiment of the present disclosure.

FIG. 3 is a schematic diagram of an electronic device according to an embodiment of the present disclosure. The electronic device shown in FIG. 3 is merely an example, and should not bring any limitation to functions and the scope of use of the embodiments of the present disclosure.

As illustrated in FIG. 3, the electronic device 200 includes: a memory 210, a processor 220 and a computer program stored on the memory 210 and executable on the processor 220. When the program is executed by the processor 220, the processor 220 is configured to perform the test method for the adapter as described in the above embodiments.

Figure 4:
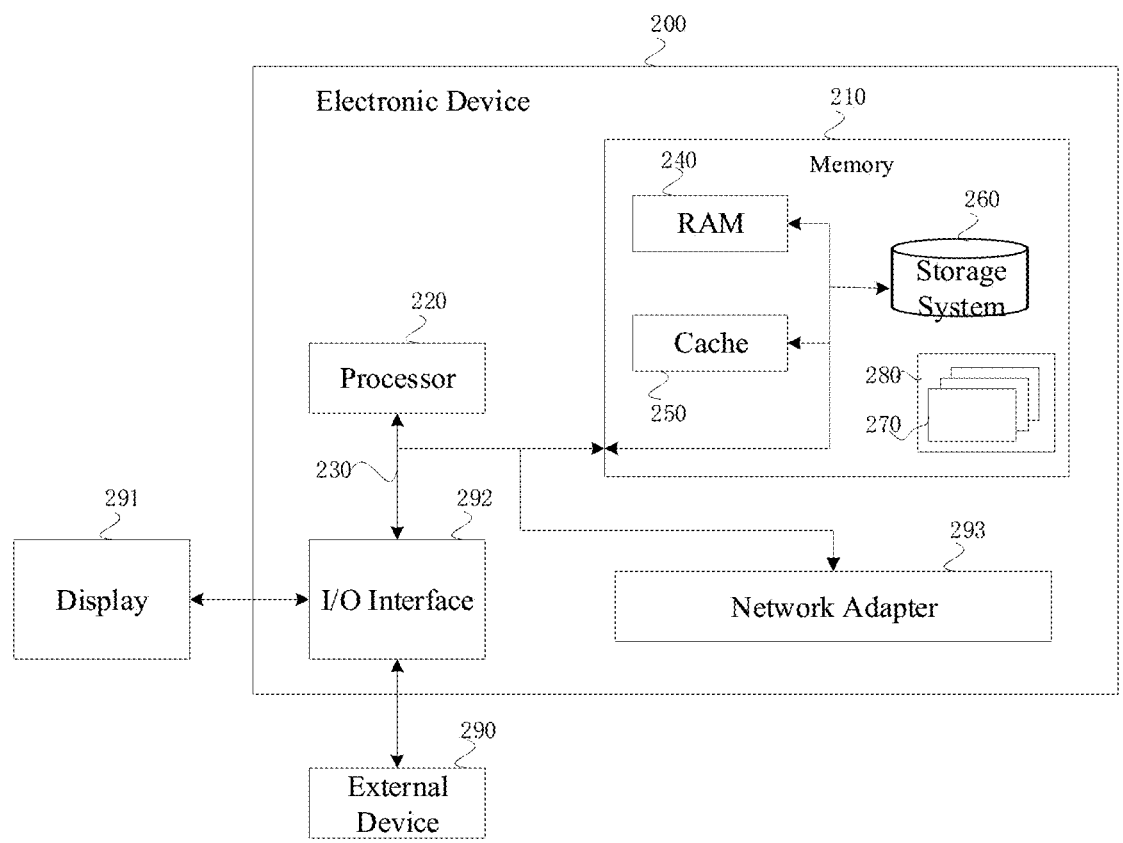
FIG. 4 is a schematic diagram of an electronic device according to another embodiment of the present disclosure.

In an alternative implementation, as illustrated in FIG. 4, the electronic device 200 may further include the memory 210, the processor 220, and a bus 230 connecting different components (including the memory 210 and the processor 220). The memory 210 stores a computer program. When the processor 220 executes the program, the processor 220 implements the test method for the adapter according to the embodiments of the present disclosure.

The bus 230 represents one or more of several types of bus architectures, including a memory bus or a memory control bus, a peripheral bus, a graphic acceleration port (GAP) bus, a processor bus, or a local bus using any bus architecture in a variety of bus architectures. For example, these architectures include, but are not limited to, an industry standard architecture (ISA) bus, a micro-channel architecture (MCA) bus, an enhanced ISA bus, a video electronic standards association (VESA) local bus, and a peripheral component interconnect (PCI) bus.

Typically, the electronic device 200 may include multiple kinds of computer-readable media. These media may be any storage media accessible by the electronic device 200, including transitory or non-transitory storage medium and movable or unmovable storage medium.

The memory 210 may include a computer-readable medium in a form of volatile memory, such as a random access memory (RAM) 240 and/or a cache memory 250. The electronic device 200 may further include other transitory/non-transitory storage media and movable/unmovable storage media. In way of example only, the storage system 260 may be used to read from and write into non-removable, non-volatile magnetic media (not shown in FIG. 4, commonly referred to as "hard disk drives"). Although not illustrated in FIG. 4, it may be provided a disk driver for reading from and writing into movable non-volatile magnetic disks (e.g. "floppy disks"), as well as an optical driver for reading from and writing into movable non-volatile optical disks (e.g. a compact disc read only memory (e.g. CD-ROM, DVD-ROM, or other optical media). In these cases, each driver may be connected to the bus 230 via one or more data medium interfaces. The memory 210 may include at least one program product, which has a set of (for example at least one) program modules configured to perform the functions of embodiments of the present disclosure.

A program/utility tool 280 with a set of (at least one) program modules 270 may be stored in memory 210, the program modules 270 may include, but not limit to, an operating system, one or more application programs, other program modules and program data, and any one or combination of above examples may include an implementation in a network environment. The program modules 270 are generally configured to implement functions and/or methods described in embodiments of the present disclosure.

The electronic device 200 may also communicate with one or more external devices 290 (e.g., a keyboard, a pointing device, a display 291, and etc.) and may also communicate with one or more devices that enables a user to interact with the electronic device 200, and/or any device (e.g., a network card, a modem, and etc.) that enables the electronic device 200 to communicate with one or more other computing devices. This kind of communication can be achieved by the input/output (I/O) interface 292. In addition, the electronic device 200 may communicate with one or more networks such as a local area network (LAN), a wide area network (WAN) and/or a public network such as the Internet through a network adapter 293. As illustrated in FIG. 4, the network adapter 293 communicates with other modules of the electronic device 200 over the bus 230. It should be understood that although not shown, other hardware and/or software modules may be used in combination with the electronic device 200, which include, but not limited to, microcode, device drivers, redundant processing units, external disk drive arrays, RAID systems, tape drives, as well as data backup storage systems and the like.

It should be noted that, with respect to the implementation process and the technical principle of the electronic device according to the embodiments, reference may be made to the explanation of the test method for the adapter according to the foregoing embodiments, which are not elaborated here.

With the electronic device according to embodiments of the present disclosure, the temperatures of the elements in the adapter are detected first, and then it is determined whether the adapter is in the temperature balance state according to the temperatures of the elements in the adapter, and the ambient temperature of the environment where the adapter is located is increased in response to the adapter being in the temperature balance state, and further the output power of the adapter is detected and it is determined whether the adapter performs the power reduction operation before the temperatures of the elements reach the first preset temperature threshold, and it is determined that the test for the adapter fails when the power reduction operation does not occur. Therefore, an over-temperature protection mechanism of the adapter is detected by determining whether the adapter has the power-reduction protection operation before reaching the safe temperature threshold, which increases an over-temperature-protection test item of the adapter, and ensures that the adapter that has gone through the detection may reduce the temperature by reducing the output power, thereby avoiding a damage to the adapter due to an excessive temperature in the actual use and improving the reliability of the test for the adapter.

To realize the above objectives, the present disclosure further provides a computer readable storage medium.

With respect to the computer readable storage medium, a computer program is stored thereon. When the program is executed by a processor, the test method for the adapter according to the above embodiments is implemented.

In an alternative implementation, the embodiment may adopt any combination of one or more computer readable media. The computer readable medium may be a computer readable signal medium or a computer readable storage medium. The computer readable storage medium may be, but is not limited to, for example, an electrical, magnetic, optical, electromagnetic, infrared, or semiconductor system, apparatus, device, component or any combination thereof. A specific example of the computer readable storage media include (a non-exhaustive list): an electrical connection having one or more wires, a portable computer disk, a hard disk, a random access memory (RAM), a read only memory (ROM), an Erasable Programmable Read Only Memory (EPROM) or a flash memory, an optical fiber, a compact disc read-only memory (CD-ROM), an optical memory component, a magnetic memory component, or any suitable combination thereof. In context, the computer readable storage medium may be any tangible medium including or storing programs. The programs may be used by an instruction executed system, apparatus or device, or a connection thereof.

The computer readable signal medium may include a data signal propagating in baseband or as part of carrier, which carries a computer readable program codes. Such propagated data signal may be in many forms, including but not limited to an electromagnetic signal, an optical signal, or any suitable combination thereof. The computer readable signal medium may also be any computer readable medium other than the computer readable storage medium, which may send, propagate, or transport programs used by an instruction executed system, apparatus or device, or a connection thereof.

The program code stored on the computer readable medium may be transmitted using any appropriate medium, including but not limited to wireless, wireline, optical fiber cable, RF, or any suitable combination thereof.

The computer program code for carrying out operations of embodiments of the present disclosure may be written in one or more programming languages. The programming language includes an object oriented programming language, such as Java, Smalltalk, C++, as well as conventional procedural programming language, such as "C" language or similar programming language. The program code may be executed entirely on a user's computer, partly on the user's computer, as a separate software package, partly on the user's computer, partly on a remote computer, or entirely on the remote computer or server. In a case of the remote computer, the remote computer may be connected to the user's computer or an external computer (such as using an Internet service provider to connect over the Internet) through any kind of network, including a Local Area Network (hereafter referred as to LAN) or a Wide Area Network (hereafter referred as to WAN).

In the description of the present disclosure, reference throughout this specification to "an embodiment," "some embodiments," "example," "a specific example," or "some examples," means that a particular feature, structure, material, or characteristic described in connection with the embodiment or example is included in at least one embodiment or example of the present disclosure. In the specification, the terms mentioned above are not necessarily referring to the same embodiment or example of the present disclosure. Furthermore, the particular features, structures, materials, or characteristics may be combined in any suitable manner in one or more embodiments or examples. Besides, any different embodiments and examples and any different characteristics of embodiments and examples may be combined by those skilled in the art without contradiction. In addition, different embodiments or examples and features of different embodiments or examples described in the specification may be combined by those skilled in the art without mutual contradiction.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means at least two, for example, two or three, unless specified otherwise.

Any procedure or method described in the flow charts or described in any other way herein may be understood to comprise one or more modules, portions or elements for storing executable codes that realize particular logic functions or procedures. Moreover, advantageous embodiments of the present disclosure comprises other implementations in which the order of execution is different from that which is depicted or discussed, including executing functions in a substantially simultaneous manner or in an opposite order according to the related functions, which should be understood by those skilled in the art.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or elements of the steps in the above example method of the present disclosure may be achieved by commanding the related hardware with programs. The programs may be stored in a computer readable storage medium, and the programs comprise one or a combination of the steps in the method embodiments of the present disclosure when run on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer readable storage medium.

Although explanatory embodiments have been illustrated and described, it would be appreciated by those skilled in the art that the above embodiments are examples and cannot be construed to limit the present disclosure, and changes, modifications, alternatives and varieties can be made in the embodiments by those skilled in the art without departing from scope of the present disclosure.

What is claimed is:

1. A test method for an adapter, comprising:
   detecting temperatures of elements in the adapter;
   determining whether the adapter is in a temperature balance state according to the temperatures of the elements in the adapter;
   increasing an ambient temperature of an environment where the adapter is located to increase the temperatures of the elements in response to the adapter being in the temperature balance state and the temperatures of the elements not reaching a first preset temperature threshold;
   detecting an output power of the adapter, and determining whether the adapter performs a power reduction operation before the temperatures of the elements reach a first preset temperature threshold, wherein the adapter is configured to perform the power reduction operation on the adapter when the temperatures reach a second preset temperature threshold, wherein the second preset temperature threshold is less than the first preset temperature threshold; and
   determining that a test for the adapter fails if the adapter does not perform the power reduction operation.

2. The test method according to claim 1, before detecting the temperatures of the elements in the adapter, further comprising:
   controlling the adapter to perform a full-load output.

3. The test method according to claim 1, wherein an initial value of the ambient temperature is set to be in a range from 38 to 42 degrees.

4. The test method according to claim 1, further comprising:
   placing the adapter in a stable ambient temperature.

5. The test method according to claim 1, wherein the elements comprise field effect transistors, transformers, capacitors, and microcontroller units.

6. The test method according to claim 1, wherein determining whether the adapter is in the temperature balance state according to the temperatures of the elements in the adapter comprises:
   determining whether the temperatures keep unchanged within a preset time period; or
   determining whether a temperature variation is within a preset range within a preset time period.

7. The test method according to claim 1, wherein the first preset temperature threshold is a minimum of safe temperature thresholds of the elements in the adapter.

8. A device for testing an adapter, comprising:
   a temperature detector, configured to detect temperatures of elements in the adapter;
   a power detector, configured to detect an output power of the adapter;
   an ambient temperature regulator, configured to regulate an ambient temperature of an environment where the adapter is located; and
   a controller, configured to determine whether the adapter is in a temperature balance state according to the temperatures of the elements in the adapter, to control the ambient temperature regulator to increase the ambient temperature to increase the temperatures of the elements in response to the adapter being in the temperature balance state and the temperatures of the elements not reaching a first preset temperature threshold, to determine whether the adapter performs a power reduction operation before the temperatures of the elements in the adapter reach a first preset temperature threshold, and to determine that a test for the adapter fails if the adapter does not perform the power reduction operation, wherein the adapter is configured to perform the power reduction operation on the adapter when the temperatures reach a second preset temperature threshold, wherein the second preset temperature threshold is less than the first preset temperature threshold.

9. The device according to claim 8, wherein the ambient temperature regulator is further configured to:
   set an initial value of the ambient temperature in a range of 38 to 42 degrees.

10. The device according to claim 8, wherein the temperature detector comprises a temperature sensor.

11. The device according to claim 8, wherein the controller is further configured to control the adapter to enter a full-load output state.

12. The device according to claim 8, further comprising:
   a thermostated container, configured to receive the adapter.

13. The device according to claim 8, wherein the controller is configured to:
   determine that the adapter is in the temperature balance state if the temperatures keep unchanged within a preset time period; or
   determine that the adapter is in the temperature balance state if a temperature variation is within a preset range within a preset time period.

14. The device according to claim 8, wherein the first preset temperature threshold is a minimum of safe temperature thresholds of the elements in the adapter.

15. A non-transitory computer readable storage medium having a computer program stored thereon, wherein when the computer program is executed by a processor, a test method for an adapter is implemented, the method comprising:
   obtaining temperatures of elements in the adapter;

determining whether the adapter is in a temperature balance state according to the temperatures of the elements in the adapter;

controlling an ambient temperature of an environment where the adapter is located to increase the temperatures of the elements in response to the adapter being in the temperature balance state and the temperatures of the elements not reaching a first preset temperature threshold;

obtaining an output power of the adapter, and determining whether the adapter performs a power reduction operation before the temperatures of the elements reach a first preset temperature threshold, wherein the adapter is configured to perform the power reduction operation on the adapter when the temperatures reach a second preset temperature threshold, wherein the second preset temperature threshold is less than the first preset temperature threshold; and determining that a test for the adapter fails if the adapter does not perform the power reduction operation.

* * * * *